(12) United States Patent
Wilson et al.

(10) Patent No.: US 6,617,223 B2
(45) Date of Patent: Sep. 9, 2003

(54) SEMICONDUCTOR-ON-INSULATOR STRUCTURE FABRICATION HAVING A TEMPORARY PLUG

(75) Inventors: Martin Clive Wilson, Cricklade (GB); Simon Lloyd Thomas, Swindon (GB)

(73) Assignee: Zarlink Semiconductor Limited (GB)

( * ) Notice: Subject to any disclaimer, the term of this patent is extended or adjusted under 35 U.S.C. 154(b) by 0 days.

(21) Appl. No.: 10/080,136

(22) Filed: Feb. 21, 2002

(65) Prior Publication Data

US 2002/0119638 A1 Aug. 29, 2002

(30) Foreign Application Priority Data

Feb. 22, 2001 (GB) .............................................. 0104333

(51) Int. Cl.[7] .............................................. H01L 21/76
(52) U.S. Cl. ........................ 438/404; 438/424; 438/432
(58) Field of Search ................................. 438/404, 405, 438/413, 424, 427, 429, 432, 435, 440, 450, 444

(56) References Cited

U.S. PATENT DOCUMENTS

| | | | |
|---|---|---|---|
| 5,276,338 A | * | 1/1994 | Beyer et al. .................. 257/52 |
| 5,811,315 A | * | 9/1998 | Yindeepol et al. .......... 438/405 |
| 6,387,772 B1 | * | 5/2002 | Chittipeddi et al. ........ 438/386 |

\* cited by examiner

Primary Examiner—Carl Whitehead, Jr.
Assistant Examiner—Yennhu B Huynh
(74) Attorney, Agent, or Firm—Thompson Hine LLP

(57) ABSTRACT

A method of forming an electrical isolation trench in a silicon-on-insulator (SOI) structure. The method comprises forming a first oxide layer on top of the upper silicon layer of the SOI structure, forming a polysilicon layer on top of said oxide layer, forming a second oxide layer on top of said polysilicon layer, patterning the first oxide layer, polysilicon layer, and second oxide layer to provide an etch mask, etching the upper silicon layer of the SOI structure to form said trench, and removing said second oxide layer and said polysilicon layer.

9 Claims, 5 Drawing Sheets

SEMICONDUCTOR-ON-INSULATOR STRUCTURE FABRICATION HAVING A TEMPORARY PLUG

This application claims priority to British Patent Application No. 0104333.0 filed on Feb. 22, 2001.

BACKGROUND

The present invention relates to semiconductor-on-insulator structures and more particularly, though not necessarily, to silicon-on-insulator structures and to a method of fabricating isolation trenches within such structures.

So called silicon-on-insulator (SOI) structures are known to provide improved performance and reduced power consumption for silicon based electrical devices, due to the electrical isolation of the substrate provided by the underlying oxide insulator. SOI structures may take advantage of trench device isolation in VLSI integrated circuits in order to improve device packing density. FIG. 1 illustrates such an SOI structure comprising a base silicon layer 1, a buried silicon dioxide layer 2, and a silicon substrate 3 in which electrical devices are formed. The substrate layer 3 may comprise several sub-layers (doped and undoped) and/or doped and undoped regions. Trenches 4 are etched through the substrate 3 to the buried oxide layer 2 to isolate the central region of the substrate in the horizontal plane. The walls of the trenches 4 and the surface of the substrate 3 are coated with a thin oxide layer 6 which is used for further processing of the structure. The trenches themselves are lined with dielectric silicon dioxide/silicon nitride layers and filled with polysilicon 5.

With standard silicon structures, trench processing typically involves an oxide masking layer which is chemically removed (using a wet etch) after the trench has been etched. With SOI structures however, the use of an oxide mask and its subsequent removal may cause damage to the buried oxide layer exposed by the trench—even the use of a temporary plug to fill the trench prior to wet etching does not completely avoid damage to the buried oxide layer as the wet etch tends to "wick" down the sides of the plug. The problem is compounded when a surface oxide layer of well defined thickness is required.

A method of fabricating such a device is described in U.S. Pat. No. 5,811,315. A first step is to deposit a hard mask (oxide-nitride-oxide) onto the surface of the substrate 3. The mask is patterned with photoresist, and etched to expose the surface of the substrate 3 where the trenches 4 are to be formed. The trenches 4 are then etched. A layer of sacrificial oxide is then grown on the sidewalls of the trenches and subsequently removed to remove damage to the sidewalls caused by the etching of the trench. A layer of trench lining oxide is grown, and the exposed surfaces coated with silicon nitride. The nitride is selectively removed to leave only the coatings on the trench and hard mask sidewalls. Polysilicon is then deposited to fill the trenches 4, and etched back to expose the hard mask. The upper oxide and nitride layers of the hard mask are removed, leaving only the lower oxide layer of the hard mask. It is noted that the nitride coating on the exposed sidewalls of the lower oxide layer protects the oxide layer from under etching when the upper oxide layer is removed.

The method of U.S. Pat. No. 5,811,315 is complex insofar as it requires a large number of processing steps. This results in part from the need to protect sensitive regions when performing the removal of the upper oxide layer of the hard mask.

SUMMARY

According to a first aspect of the present invention there is provided a method of forming an electrical isolation trench in a semiconductor-on-insulator structure, the method comprising:

forming a first oxide layer on top of the upper silicon layer of the semiconductor-on-insulator structure;

forming a polysilicon layer on top of said oxide layer;

forming a second oxide layer on top of said polysilicon layer;

patterning the first oxide layer, polysilicon layer, and second oxide layer to provide an etch mask;

etching the upper semiconductor layer of the semiconductor-on-insulator structure to form said trench;

filling the trench with a temporary plug;

removing said second oxide layer;

removing said polysilicon layer;

removing said temporary plug either before or after removing the polysilicon layer; and filling the trench with dielectric material.

Preferably, the semiconductor-on-insulator structure is a silicon-on-insulator structure.

Preferably, the method comprises the following steps, subsequent to said step of etching the upper silicon layer of the semiconductor-on-insulator structure to form said trench but prior to said step of removing said second oxide layer and said polysilicon layer:

forming an oxide layer on the sidewalls of the trench; and filling the trench with resist.

An advantage of forming a polysilicon layer beneath the second oxide layer is that, because the selectivity of oxide to polysilicon for an oxide plasma dry etch is relatively high, the second oxide layer can be removed using a dry etch with the polysilicon providing an etch stop. If a nitride layer is used instead of polysilicon (as proposed in the prior art), the nitride would be etched by the oxide plasma etch.

Following removal of the second oxide layer, the protective resist is removed from the trench. The polysilicon layer is then removed with a wet etch. As the polysilicon to oxide selectivity of the polysilicon wet etch is high, the oxide beneath the polysilicon will be relatively undamaged.

Preferably, said trench extends through the upper silicon layer of the semiconductor-on-insulator structure to a buried oxide layer of the structure.

Preferably, following removal of said second oxide layer and said polysilicon layer, a nitride layer is formed on the exposed surfaces. The trench may then be filled with polysilicon.

Preferably, said first oxide layer is grown on the upper semiconductor layer of the semiconductor-on-insulator structure, whilst the polysilicon and second oxide layers are formed by deposition.

According to a second aspect of the present invention there is provided a semiconductor-on-insulator structure having at least one trench formed therein using the method of the above first aspect of the present invention.

According to a third aspect of the present invention there is provided a method of forming an electrical isolation trench in a semiconductor-on-insulator structure, the method comprising:

forming a first oxide layer on top of the upper semiconductor layer of the semiconductor-on-insulator structure;

forming one or more mask layers on top of said first oxide layer;

patterning the first oxide layer and the one or more mask layers to provide an etch mask;

etching the upper semiconductor layer of the semiconductor-on-insulator structure to form said trench;

filling the trench with resist; and removing said one or more mask layers.

Preferably, the method comprises forming at least two mask layers on top of said first oxide layer, and removing the resist from the trench subsequent to removing a first of the mask layers but prior to removing a second of the mask layers.

BRIEF DESCRIPTION OF THE DRAWINGS

For a better understanding of the present invention and in order to show how the same may be carried into effect reference will now be made, by way of example, to the accompanying drawings, in which.

DETAILED DESCRIPTION

A method of fabricating polysilicon filled trenches in silicon-on-insulator will now be described with reference to FIGS. 2 to 13.

Figure 1:
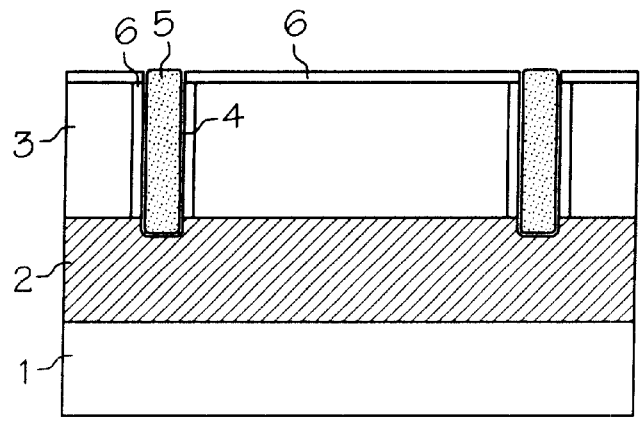
FIG. 1 illustrates a silicon-on-insulator structure having trenches formed therein.
Figure 2:
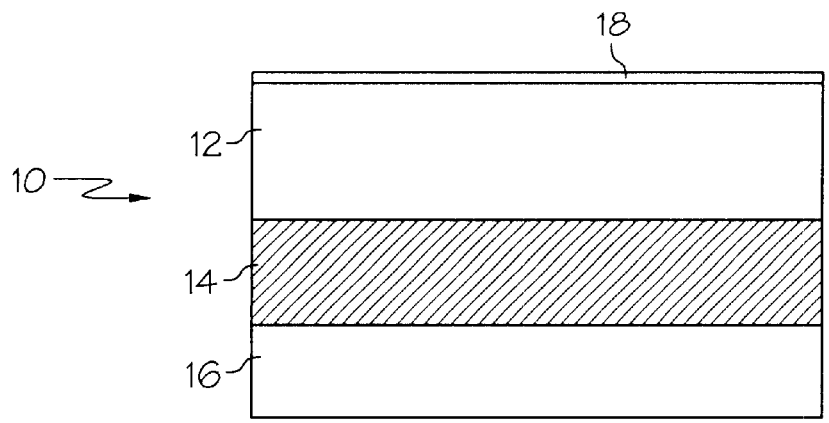
FIGS. 2 to 14 illustrate a series of steps in the process of fabricating a silicon-on-insulator structure having trenches formed therein.

The SOI start material 10 is typically 2.5 $\mu$m+/−0.5 $\mu$CZ (100) p-type silicon 12 on 1.0 $\mu$m silicon dioxide 14 on 600 $\mu$m CZ (100) p-type silicon 16. The silicon top layer 12 may contain n- and p-type doped regions and an epitaxial layer as appropriate for the final application. A surface layer of thermal oxide 18 is grown under controlled conditions to a thickness of approximately 1000A (FIG. 2). The thickness, uniformity, reproducibility, and material properties of the thermal oxide layer 18 are extremely important for subsequent local oxide isolation processing steps.

Figure 3:
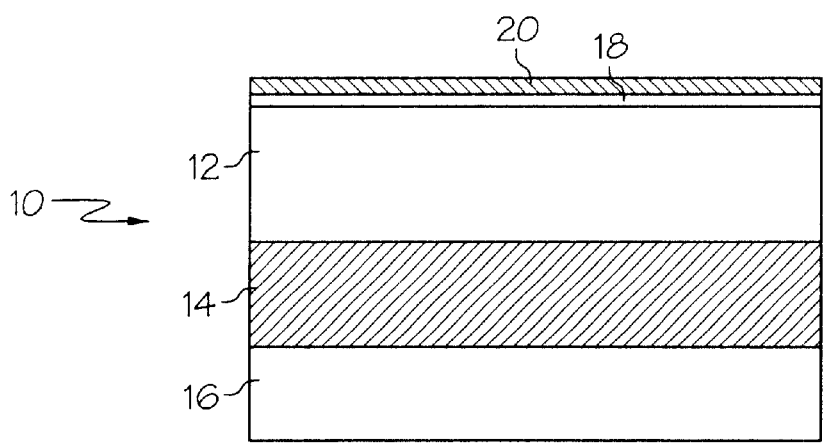
Figure 4:
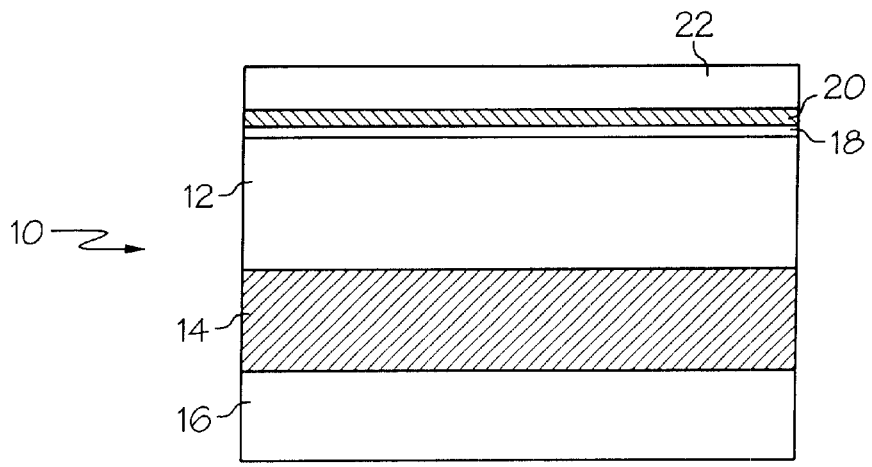

As shown in FIG. 3, a layer of undoped polysilicon 20 (approximately 1500A thick) is deposited on to the top of the oxide layer 18 using low pressure chemical vapour deposition (LPCVD). This process is typically carried out at 550° C., with the resulting polysilicon 20 being amorphous in microstructure with a smooth topography. On top of the polysilicon 20, a layer of undoped, silane based CVD silicon dioxide 22 is deposited. This layer, shown in FIG. 4, is deposited at around 400° C. to a depth of approximately 3000A.

Figure 5:
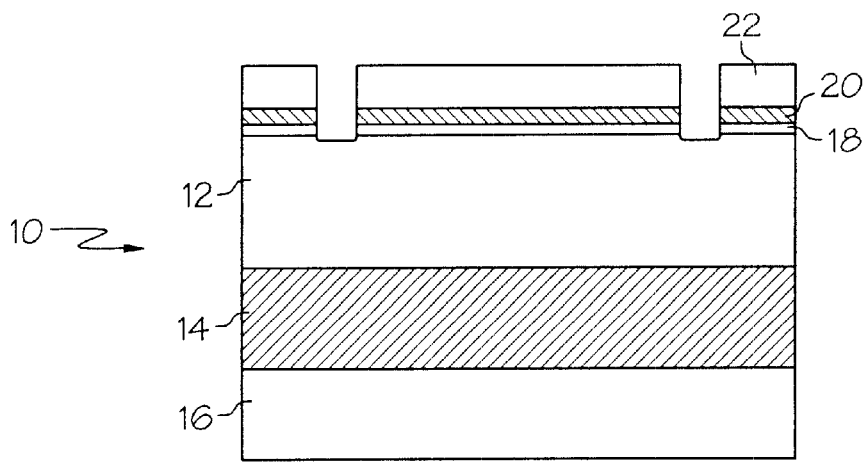

Onto the surface of the silicon dioxide layer 22, a resist mask is formed. The mask is patterned using standard photolithographic techniques to define a "trench" mask. The critical trench feature sizes are typically 0.8 $\mu$m wide. The trench pattern is replicated into the underlying deposited oxide 22, polysilicon 20, and grown oxide 18 layers by a multistage etch technique which sequentially etches the oxide and polysilicon layers. The etch process stops at the surface of the silicon top layer 12 as shown in FIG. 5. The resist mask is removed using standard techniques.

Figure 6:
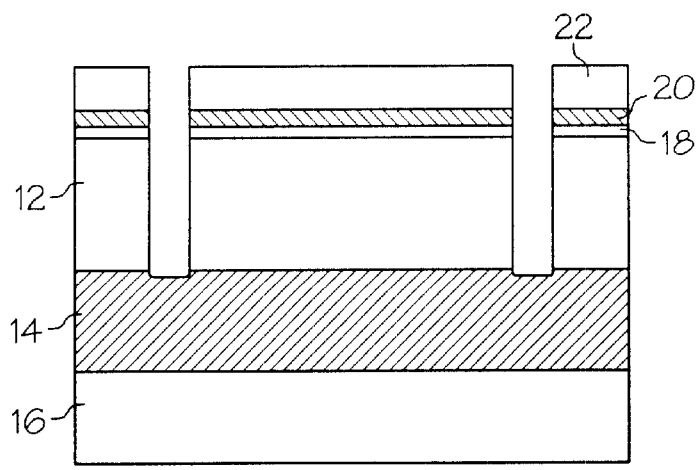

The next process step is to replicate the trench mask into the silicon top layer 12 using the combined deposited oxide 22, polysilicon 20, and thermally grown oxide 18 layers as a "hard mask." The required etch is carried out using a standard silicon dry etch technique. The silicon trench etch is designed to stop just below the upper surface of the buried oxide layer 14, with sufficient over-etch being carried out to accommodate any variation in thickness of the silicon top layer 12. This stage is illustrated in FIG. 6.

After the trench silicon etch, the structure must be cleaned to remove debris and polymeric film bi-products. In structures where no SOI trench processing is carried out, this usually involves exposure to HF acid and can be combined with removal of an oxide hard mask. However, where SOI trench processing is required, exposure to HF acid should be avoided or at least very carefully controlled. This is because the buried oxide 14 is exposed and will be attacked by the HF acid. Nevertheless, the polymeric film (which is a bi-product of the trench silicon etch) must be removed to avoid contamination and to allow good adhesion of any subsequent layers and is best removed with HF acid. A very dilute HF solution is therefore used (100:1HF) in a 30 second spray rinse process. This is sufficient to remove the polymer film with only minimal attack on the exposed oxides (removing 100A or less of oxide).

Figure 7:
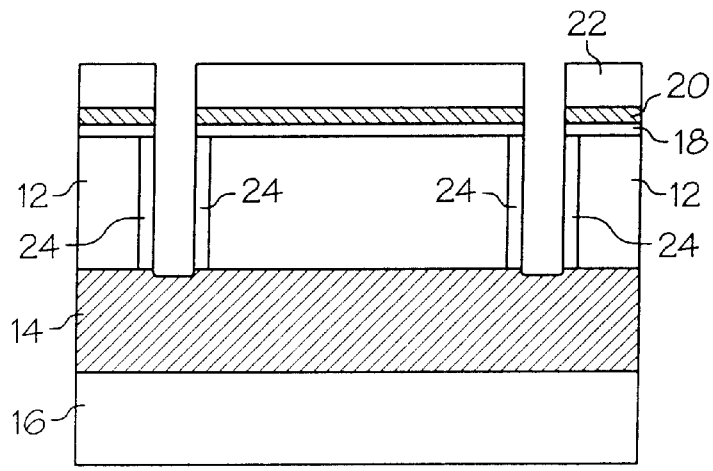

With the hard mask still in place, the structure is oxidised using standard furnace oxidation techniques to grow a silicon dioxide film 24 up to 1000A thick on the exposed sidewalls of the etched trenches—see FIG. 7—providing a high quality silicon dioxide trench lining to laterally isolate devices from one another. The required thickness of the silicon dioxide layer 24 is determined by several factors including the oxide quality, operating voltages, and the stresses resulting from subsequent layers.

Figure 8:
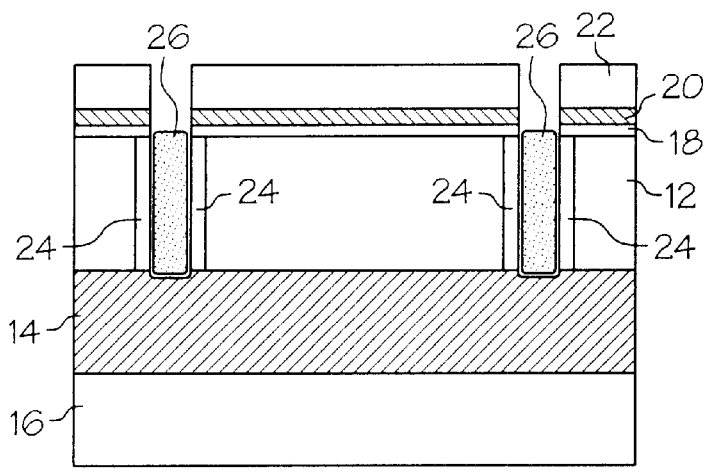
Figure 9:
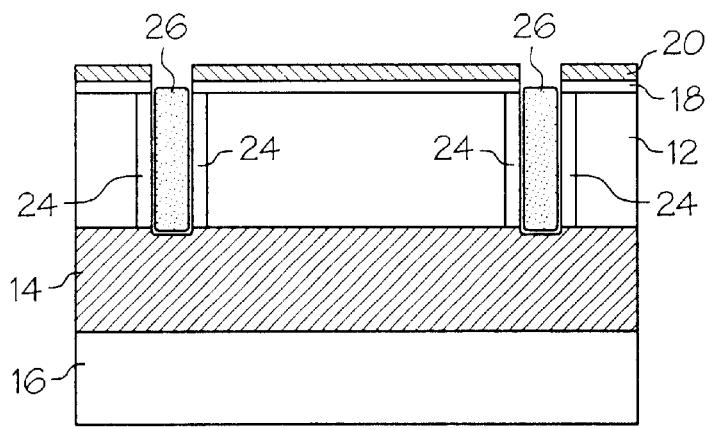

With the trenches lined, the hard mask layers can now be removed. The trench is first plugged, temporarily, with a standard photoresist 26 using conventional photolithographic techniques. The SOI structure after this process step is illustrated in FIG. 8. The plug 26 prevents etch damage during removal of the uppermost deposited oxide layer 22, which is carried out using a dry etch which is stopped at the polysilicon layer 20. The etch selectivity is generally high allowing significant over etch and complete removal of the oxide layer 22—FIG. 9. Preferably, the trench plug 26 rises at least to the level of the interface between the thermal oxide layer 18 and the polysilicon 20 to prevent undercut during removal of the deposited oxide 22. However, as the oxide etch can be made anisotropic (i.e. directional), the plug depth is not critical and need only protect the buried oxide layer 14.

Figure 10:
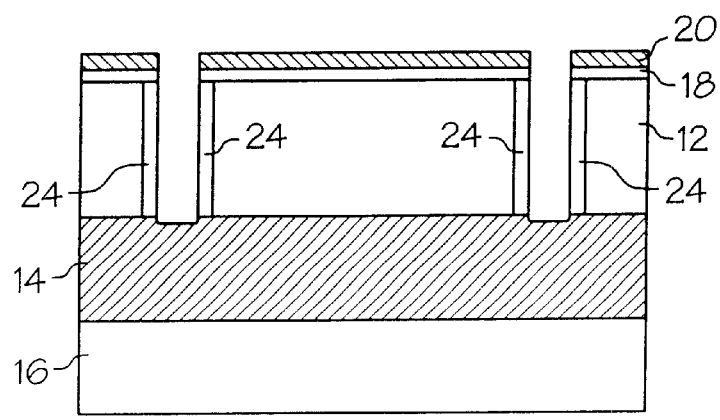
Figure 11:
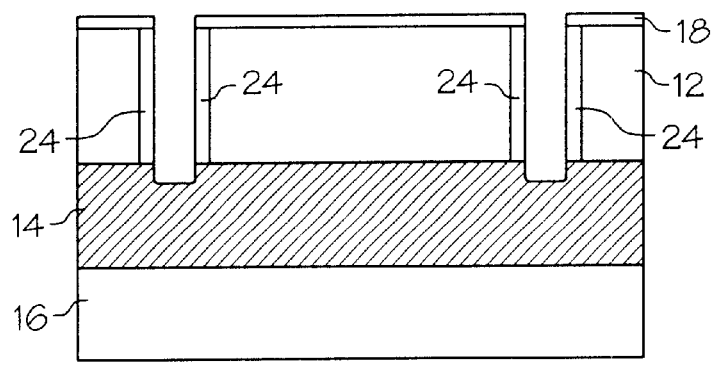

The resist plug 26 can then be removed from the trench as shown in FIG. 10 (using a hot dilute solution of sulphuric acid and hydrogen peroxide), after which the polysilicon layer 20 is removed using a solution of potassium hydroxide (KOH)—FIG. 11. The latter etch has the advantage of extremely high etch selectivity and can completely remove the polysilicon with only minimal attack on the silicon dioxide. The result is that very little (<100A) of the exposed buried oxide layer 14 (at the base of the trench), side wall oxide lining 24, and surface oxide layer is removed by the polysilicon etch.

Figure 12:
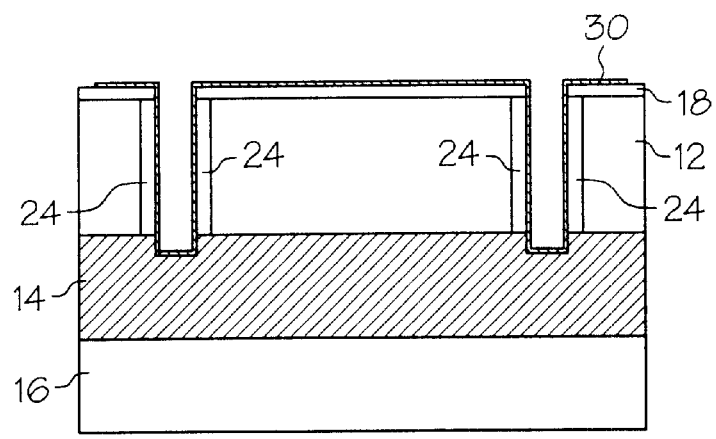

After thorough cleaning and rinsing of the structure, a silicon nitride layer 30 is deposited by a LPCVD process (450° C.) to a thickness of 300A—FIG. 12. The nitride film 30 is highly conformal and adds a second lining layer to the trench. The thickness, uniformity, conformity, and material properties are important as the film will constitute a part of the dielectric isolation as well as part of the structure necessary for local oxide isolation (the nitride is patterned and oxidation occurs in the regions where the mask has been removed) during further processing of the device.

The final process stage (of this phase of the complete fabrication process) involves the in-fill and planarisation of the trench. Firstly, a silicon dioxide etch-stop layer 32 is conformally deposited onto the nitride 30. Typically, this is an undoped, TEOS (tetra ethyloxy silane) based CVD silicon dioxide deposited at 350° C. to a thickness of approximately 1000A. The deposition details of the oxide layer 32 are not critical but some care must be taken with regard to the total stress in the combined layers that make up the trench lining. Secondly, a polysilicon layer is deposited to a thickness of approximately 1.1 $\mu$m (for a trench which is 0.8 $\mu$m wide, 0.4 $\mu$m attaches to each sidewall to fill the trench). This thickness is not critical, but will depend on the width of the trench to be filled—wider trenches requiring a thicker polysilicon layer. The result of the deposition should be a completely filled trench, and a polysilicon film with a flat, uniform surface.

Figure 13:
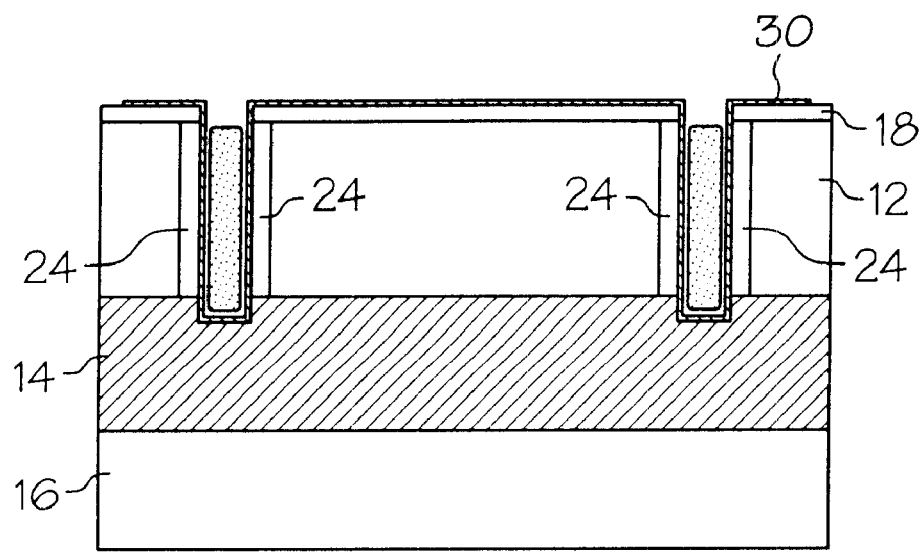
Figure 14:
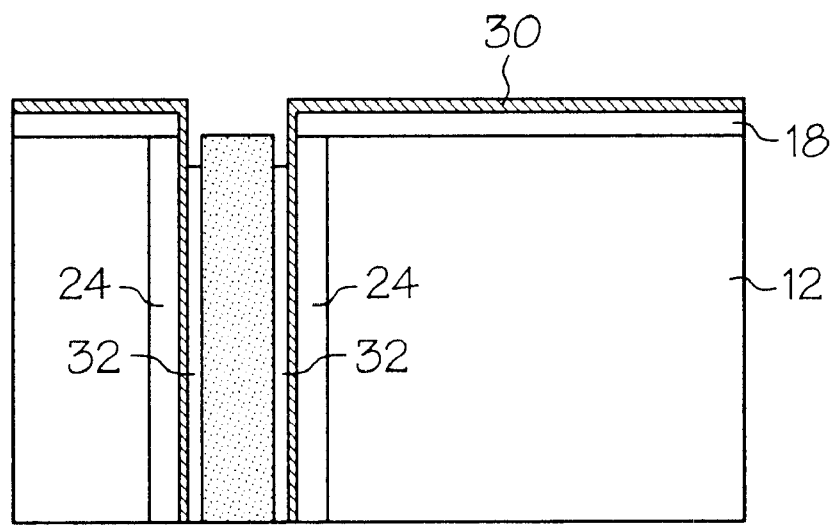

The polysilicon is then etched back using a dry etch to the deposited oxide layer 32 which provides an etch stop. This etch stop oxide 32 can then be removed using an HF acid solution (NB, there is now no exposed oxide, other than the stop layer, to be damaged by the HF etch). The resulting structure is illustrated in FIG. 13, and in more detail in the expanded view of FIG. 14, and comprises a filled trench and an exposed, undamaged silicon nitride film 30.

The method described above involves few high temperature process steps. This enables the trench formation to be carried out later in the IC fabrication process, if required, as compared with conventional trench formation processes. For example, the trenches may be formed after active area definition, i.e. after local oxidation.

It will be appreciated by the person of skill in the art that various modifications may be made to the above described embodiment without departing from the scope of the present invention. For example, the start wafer may be different from that described above, for example, silicon-on-sapphire, silicon-on-anything, or SIMOX (implanted oxygen). The invention may also be applied to materials other than silicon, for example silicon-germanium alloys, other silicon alloys, gallium arsenide, and indium phosphide. In the cases where low temperature processing is a pre-requisite, the deposited silicon dioxide, silicon nitride and polysilicon layers, can be formed by low temperature sputtering or plasma enhanced deposition techniques (rather than high temperature thermal growth).

What is claimed is:

1. A method of forming an electrical isolation trench in a semiconductor-on-insulator structure, the method comprising:

forming a first oxide layer on top of an upper semiconductor layer of the semiconductor-on-insulator structure;

forming a polysilicon layer on top of said first oxide layer;

forming a second oxide layer on top of said polysilicon layer;

patterning the first oxide layer, polysilicon layer, and second oxide layer to provide an etch mask;

etching the upper semiconductor layer of the semiconductor-on-insulator structure to form said trench;

filling the trench with a temporary plug;

removing said second oxide layer;

removing said polysilicon layer;

removing said temporary plug either before or after removing the polysilicon layer; and filling the trench with dielectric material.

2. A method according to claim 1, wherein the semiconductor-on-insulator structure is a silicon-on-insulator structure.

3. A method according to claim 1 and comprising, subsequent to said step of etching the upper semiconductor layer of the semiconductor-on-insulator structure to form said trench but prior to said step of removing said second oxide layer and said polysilicon layer, forming an oxide layer on the sidewalls of the trench.

4. A method according to claim 3 and comprising, subsequent to said step of forming an oxide layer on the sidewalls of the trench, filling the trench with resist and, following removal of the second oxide layer, removing the resist from the trench, and removing the polysilicon layer.

5. A method according to claim 1, wherein said trench extends through the upper semiconductor layer of the semiconductor-on-insulator structure to a buried oxide layer of the structure.

6. A method according to claim 1 and comprising, following removal of said second oxide layer and said polysilicon layer, forming a nitride layer on the exposed surfaces and subsequently filling the trench with polysilicon.

7. A method according to claim 1, wherein said first oxide layer is grown on the upper semiconductor layer of the semiconductor-on-insulator substrate, while the polysilicon and second oxide layers are formed by deposition.

8. A method of forming an electrical isolation trench in a semiconductor-on-insulator structure, the method comprising:

forming a first oxide layer on top of an upper semiconductor layer of the semiconductor-on-insulator structure;

forming one or more mask layers on top of said first oxide layer;

patterning the first oxide layer and the one or more mask layers to provide an etch mask;

etching the upper semiconductor layer of the semiconductor-on-insulator structure to form said trench;

filling the trench with resist; and removing said one or more mask layers.

9. A method according to claim 8 and comprising forming at least two mask layers on top of said first oxide layer, and removing the resist from the trench subsequent to removing a first of the mask layers but prior to removing a second of the mask layers.

* * * * *